(12) United States Patent
Lee et al.

(10) Patent No.: US 9,118,034 B2
(45) Date of Patent: Aug. 25, 2015

(54) METAL OXIDE THIN FILM SUBSTRATE FOR OLED AND METHOD OF FABRICATING THE SAME

(71) Applicant: Samsung Corning Precision Materials Co., Ltd., Gyeongsangbuk-do (KR)

(72) Inventors: Joo Young Lee, ChungCheongNam-Do (KR); June Hyoung Park, ChungCheongNam-Do (KR); Young Zo Yoo, ChungCheongNam-Do (KR); Seo Hyun Kim, ChungCheongNam-Do (KR); Jeong Woo Park, ChungCheongNam-Do (KR); Il Hee Baek, ChungCheongNam-Do (KR); Gun Sang Yoon, ChungCheongNam-Do (KR); Hyunhee Lee, ChungCheongNam-Do (KR); Eun Ho Choi, ChungCheongNam-Do (KR)

(73) Assignee: Samsung Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/049,345

(22) Filed: Oct. 9, 2013

(65) Prior Publication Data

US 2014/0103336 A1    Apr. 17, 2014

(30) Foreign Application Priority Data

Oct. 11, 2012    (KR) .......................... 10-2012-0112729

(51) Int. Cl.
*H01L 21/16*    (2006.01)
*H01J 1/62*    (2006.01)
*H01J 63/04*    (2006.01)

(Continued)

(52) U.S. Cl.
CPC ........ *H01L 51/5262* (2013.01); *H01L 51/5268* (2013.01); *H01L 51/56* (2013.01)

(58) Field of Classification Search
CPC ....................................................... H01L 51/52
USPC .................................... 257/40, 43; 438/29, 98
See application file for complete search history.

(56) References Cited

U.S. PATENT DOCUMENTS

2002/0140339 A1* 10/2002 Lee et al. ....................... 313/466
2005/0225234 A1* 10/2005 Tyan et al. ..................... 313/504

(Continued)

FOREIGN PATENT DOCUMENTS

KR    20100100628 A    9/2010

OTHER PUBLICATIONS

Akurati, Kranthi K., et al, One-step flame synthesis of SnO2 composite nanoparticles for photocatalytic applications, International Journal of Photoenergy, vol. 07, 2005.

(Continued)

*Primary Examiner* — Shaun Campbell
*Assistant Examiner* — Ismail Muse
(74) *Attorney, Agent, or Firm* — Lerner, David, Littenberg, Krumholz & Mentlik, LLP (57) ABSTRACT

A metal oxide thin film substrate for an organic light-emitting device (OLED) which exhibits superior light extraction efficiency and can be easily fabricated at low cost and a method of fabricating the same and a method of fabricating the same. The metal oxide thin film substrate for an OLED includes a base substrate and a metal oxide thin film formed on the base substrate, the metal oxide thin film being made of a mixture of at least two metal oxides having different refractive indices.

4 Claims, 7 Drawing Sheets

(51) Int. Cl.
*H01L 51/52* (2006.01)
*H01L 51/56* (2006.01)

(56) References Cited

U.S. PATENT DOCUMENTS

| | | | |
|---|---|---|---|
| 2009/0202819 A1* | 8/2009 | Asahi et al. | 428/336 |
| 2010/0150513 A1 | 6/2010 | Zhang et al. | |
| 2010/0225229 A1 | 9/2010 | Hosoda et al. | |
| 2010/0330716 A1* | 12/2010 | Tyan et al. | 438/29 |
| 2011/0045259 A1 | 2/2011 | Bockmeyer et al. | |
| 2011/0169136 A1* | 7/2011 | Pickett et al. | 257/537 |
| 2011/0182802 A1* | 7/2011 | Garg et al. | 423/578.1 |

OTHER PUBLICATIONS

Hari Prasad Naidu and Anil V. Virkar, Low-Temperature TiO2-SnO2 Phase Diagram Using the Molten-Salt Method, Journal of the American Ceramic Society, vol. 81, No. 8, Aug. 1998.

Spinodal, From Wikipedia, Retrieved from "http://en.wikipedia.org/w/ index. php?title=Spinodal&oldid=634344456," Nov. 17, 2014.

Harizanov, et al., Study of sol-gel TiO2 and TiO2—MnO obtained from a peptized solution, Materials Letters 49 (2001) pp. 165-171.

* cited by examiner

METAL OXIDE THIN FILM SUBSTRATE FOR OLED AND METHOD OF FABRICATING THE SAME

CROSS REFERENCE TO RELATED APPLICATION

The present application claims priority from Korean Patent Application Number 10-2012-0112729 filed on Oct. 11, 2012, the entire contents of which are incorporated herein for all purposes by this reference.

BACKGROUND OF THE INVENTION

1. Field of the Invention

The present invention relates to a metal oxide thin film substrate for an organic light-emitting device (OLED) and a method of fabricating the same, and more particularly, to a metal oxide thin film substrate for an OLED which has superior light extraction efficiency and can be easily fabricated at low cost and a method of fabricating the same.

2. Description of Related Art

In general, an organic light-emitting device (OLED) includes an anode, a light-emitting layer and a cathode. When a voltage is applied between the anode and the cathode, holes are injected from the anode into a hole injection layer and then migrate from the hole injection layer through a hole transport layer to the organic light-emitting layer, and electrons are injected from the cathode into an electron injection layer and then migrate from the electron injection layer through an electron transport layer to the light-emitting layer. Holes and electrons that are injected into the light-emitting layer recombine with each other in the light-emitting layer, thereby generating excitons. When such excitons transit from the excited state to the ground state, light is emitted.

Organic light-emitting displays including an OLED are divided into a passive matrix type and an active matrix type depending on a mechanism that drives an N*M number of pixels which are arranged in the shape of a matrix.

In an active matrix type, a pixel electrode which defines a light-emitting area and a unit pixel driving circuit which applies a current or voltage to the pixel electrode are positioned in a unit pixel area. The unit pixel driving circuit has at least two thin-film transistors (TFTs) and one capacitor. Due to this configuration, the unit pixel driving circuit can supply a constant current irrespective of the number of pixels, thereby realizing uniform luminance. The active matrix type organic light-emitting display consumes little power, and thus can be advantageously applied to high definition displays and large displays.

Figure 7:
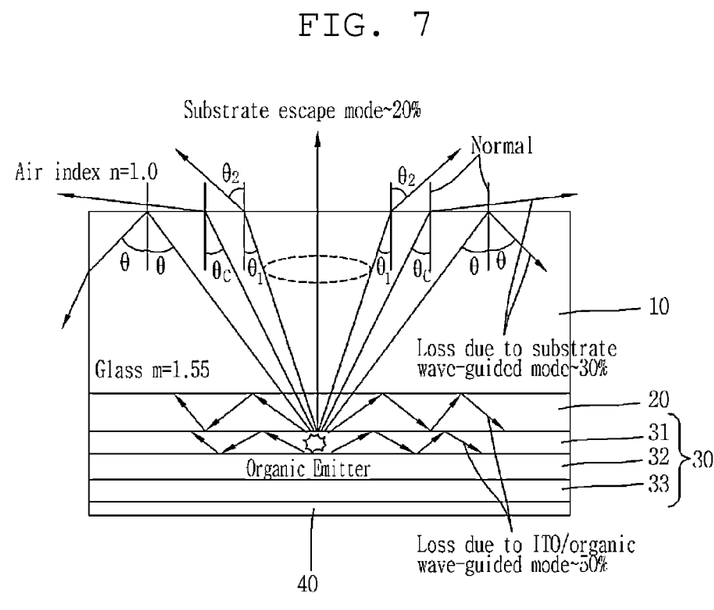
FIG. 7 is a conceptual view depicting the cross-section of an OLED of the related art and the light extraction efficiency thereof.

However, as shown in FIG. 7, only about 20% of light generated by an OLED is emitted to the outside and about 80% of the light is lost by a waveguide effect originating from the difference in the refractive index between a glass substrate 10 and an organic light-emitting layer 30 which includes an anode 20, a hole injection layer, a hole carrier layer, a light-emitting layer, an electro carrier layer and an electron injection layer and by a total internal reflection originating from the difference in the refractive index between the glass substrate 10 and the air. Specifically, the refractive index of the internal organic light-emitting layer 30 ranges from 1.7 to 1.8, whereas the refractive index of indium tin oxide (ITO) which is generally used for the anode 20 ranges from 1.9 to 2.0. Since the two layers have a very small thickness ranging from 100 to 400 nm and the refractive index of glass used for the glass substrate 10 is about 1.5, a planar waveguide is thereby formed inside the OLED. It is calculated that the ratio of the light that is lost in the internal waveguide mode due to the above-described reason is about 45%. In addition, since the refractive index of the glass substrate 10 is about 1.5 and the refractive index of the ambient air is 1.0, when the light is directed outward from the inside of the glass substrate 10, a ray of the light having an angle of incidence greater than a critical angle is totally reflected and is trapped inside the glass substrate 10. Since the ratio of the trapped light is up to about 35%, only about 20% of the generated light is emitted to the outside. Herein, reference numerals 31, 32 and 33 indicate components of the organic light-emitting layer 30. Specifically, 31 indicates the hole injection layer and the hole carrier layer, indicates the light-emitting layer, and 33 indicates the electron injection layer and the electron carrier layer.

Figure 8:
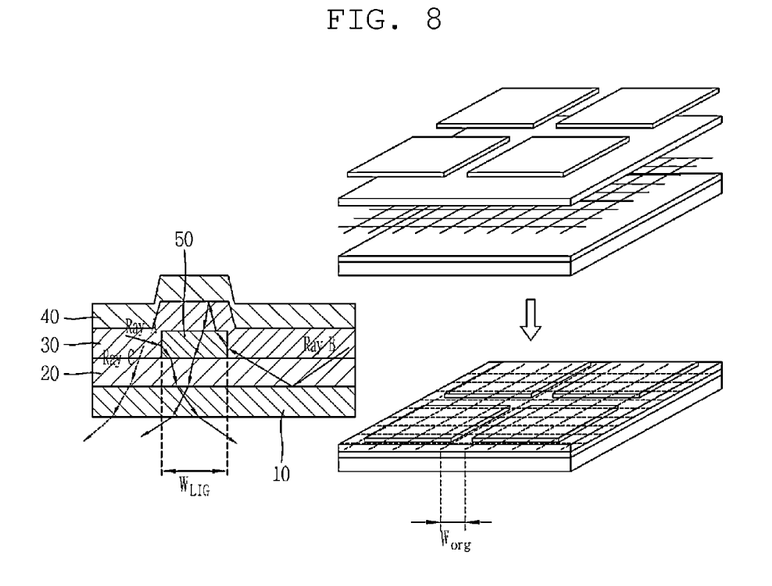
FIG. 8 is cross-sectional, exploded and assembled views showing an OLED according to another example of the related art.

In addition, as shown in FIG. 8, in order to overcome the foregoing problem, in the related art, a low index grid (LIP) 50 is formed on the ITO anode 20. The grid 50 converts the direction of the light that travels in the waveguide mode to the front surface, thereby increasing light extraction efficiency.

Figure 9:
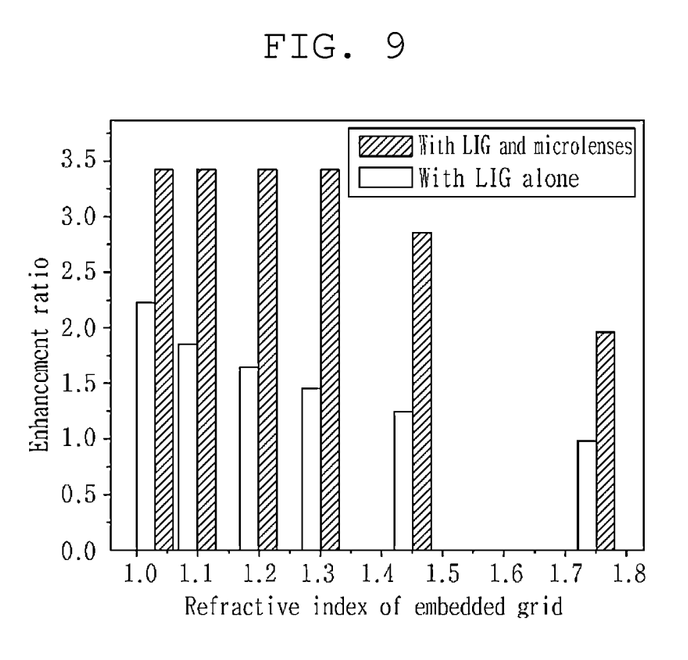
FIG. 9 is a graph showing a simulation result on the light extraction efficiency of the OLED shown in FIG. 8.

FIG. 9 shows a simulation result on the OLED shown in FIG. 8. The effect of enhancing the light extraction efficiency is increased when the refractive index of the grid 50 is lower. However, there are problems in that almost no materials have a refractive index of 1.2 or less and that the price of a material is more expensive when the refractive index is lower. In addition, when the grid 50 is formed on the ITO anode 20, as shown in FIG. 8, a stepped portion is formed. Consequently, leakage current may occur. In addition, the OLED shown in FIG. 8 has the problem of difficulty of processing. For example, in some cases, the surface of the anode 20 which adjoins the organic light-emitting layer 30 is metamorphosed in the process of forming the grid 50 on the ITO anode 20, thereby changing the work function. Furthermore, holes are not injected into the organic light-emitting layer 30 through the portion of the anode 20 on which the grid 50 is formed, and the size of the electric field applied thereto is different from the surroundings, thereby decreasing the uniformity of light generated.

Figure 10:
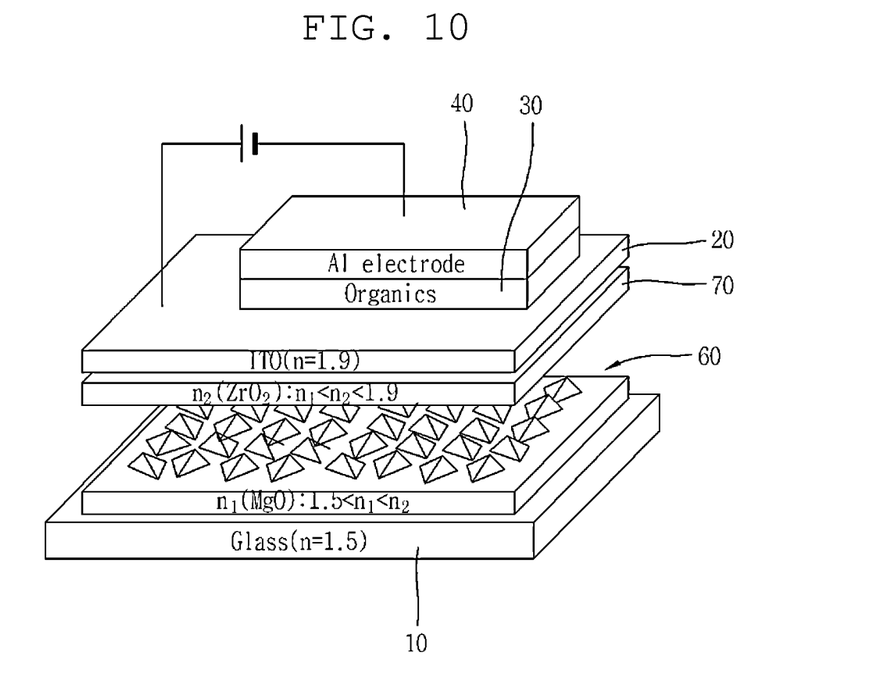
FIG. 10 is an exploded perspective view showing an OLED according to a further example of the related art.

In addition, as shown in FIG. 10, in the related art, a convex-concave structure 60 is disposed under the anode 20 (with respect to the paper surface), i.e. in the interface between the anode 20 and the glass substrate 10, in order to enhance light extraction efficiency.

As described above, the anode 20 and the organic light-emitting layer 30 generally act as one light waveguide between the cathode 40 and the glass substrate 10. Accordingly, in the state in which the anode 20 and the organic light-emitting layer 30 act in a waveguide mode, when the convex-concave structure 60 which causes light scattering is formed in the interface adjacent to the anode 20, the waveguide mode is disturbed, so that the quantity of light that is extracted to the outside is increased. However, when the convex-concave structure 60 is formed below the anode 20, the shape of the anode 20 resembles the shape of the convex-concave structure 60 below the anode 20, thereby increasing the possibility that a sharp portion may be localized. Since the OLED has a stacked structure of very thin films, when the anode 20 has a sharp protruding portion, current is concentrated in that portion, which acts as a reason for large leakage current or decreases power efficiency. Accordingly, in order to prevent such deterioration in the electrical characteristics, a flat film 70 is necessarily added when the convex-concave structure 60 is formed below the anode 20. The flat film 70 serves to make the convex and concave portions of the convex-concave structure 60 be flat. When the flat film 70 is not flat and has sharp protruding portions, the anode 20 also has protruding portions, which cause leakage current. Therefore, the flatness of the flat film 70 is very important and thus the maximum surface roughness Rpv is required to be about 30 nm or less.

In addition, the flat film 70 is required to be made of a material, the refractive index of which is similar to that of the anode 20. If the refractive index of the flat film 70 is low, most light is reflected at the interface between the anode 20 and the flat film 70 before being disturbed by the convex-concave structure 60. The light is then trapped between the anode 20 and the organic light-emitting layer 30, which is referred to as the waveguide mode. The flat film 70 is required to be as thin as possible. If the flat film 70 is too thick, more light may be unnecessarily absorbed, and the effect of scattering may be decreased since the distance between the convex-concave structure 60 and the organic light-emitting layer 30 is too large.

However, the process of completely flattening the convex-concave structure 60 using the thin flat film 70 having a thickness of several hundreds of nm is very difficult. In addition, the methods of covering and flattening the convex-concave structure 60 include deposition coating and solution coating. Since the deposition coating is characterized by forming a film following the shape of the convex-concave structure 60, the solution coating is better than the deposition coating when forming the flat film 70. However, at present, it is very difficult to obtain a solution coating material that has a high refractive index, i.e. a refractive index that is equal to or greater than the refractive index of the ITO anode 20, and that satisfies process conditions for polycrystalline thin-film transistors, such as complicated conditions required on the surface of the OLED substrate and high-temperature processing.

The information disclosed in the Background of the Invention section is provided only for better understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a metal oxide thin film substrate for an organic light-emitting device (OLED) which exhibits superior light extraction efficiency and can be easily fabricated at low cost and a method of fabricating the same and a method of fabricating the same.

In an aspect of the present invention, provided is a metal oxide thin film substrate for an organic light-emitting device (OLED) that includes a base substrate and a metal oxide thin film formed on the base substrate, the metal oxide thin film being made of a mixture of at least two metal oxides having different refractive indices.

According to an exemplary embodiment of the present invention, the metal oxides may be selected from the group consisting of $TiO_2$, $SnO_2$, $Al_2O_3$, MgO, $ZrO_2$ and ZnO.

The composition ratio between the metal oxides may be positioned within a miscibility gap depending on temperature in a phase diagram.

Here, the content of each of the metal oxides may 1% or more by volume ratio.

In addition, the metal oxide thin film may directly adjoin to an electrode of the organic light emitting device.

Here, the metal oxide thin film may be used for an internal light extraction layer of the organic light emitting device.

In another aspect of the present invention, provided is a method of fabricating a metal oxide thin film substrate for an organic light-emitting device (OLED). The method includes the following steps of: converting at least two metal oxides having different refractive indices into respective sol-gel solutions; mixing the sol-gel solutions to form a mixture; coating a base substrate with the mixture; drying the mixture that coats the base substrate; and firing the dried mixture into a metal oxide thin film.

According to an exemplary embodiment of the present invention, the metal oxides may be selected from the group consisting of $TiO_2$, $SnO_2$, $Al_2O_3$, MgO, $ZrO_2$ and ZnO.

The step of mixing the sol-gel solutions may include mixing the sol-gel solutions at a composition ratio that is positioned within a miscibility gap depending on temperature in a phase diagram.

Here, the step of mixing the sol-gel solutions may include mixing the sol-gel solutions such that the volume ratio of each of the metal oxides is 1% or more.

In addition, the step of coating the base substrate with the mixture may include depositing the mixture on the base substrate by spin coating.

According to embodiments of the present invention, a single layer of metal oxide thin film which is applied for an internal light extraction layer of an OLED is formed by mixing at least two metal oxides having different refractive indices at a composition ratio that is positioned within a miscibility gap depending on temperature in a phase diagram and at a predetermined volume ratio. The resultant metal oxide thin film can maximize light extraction efficiency by disturbing waveguide mode.

In addition, since a metal oxide sol-gel solution is deposited on a base substrate by spin coating, it is possible to economically and easily fabricate a large metal oxide thin film for an OLED and to decrease power consumption.

Furthermore, since the metal oxide thin film is formed in a single layer, it is possible to decrease the metal oxide thin film and thus minimize the possibility of leakage current when the metal oxide thin film is applied to an OLED.

In addition, it is possible to increase the efficiency and longevity of an OLED by applying the metal oxide thin film to the OLED.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

BRIEF DESCRIPTION OF THE DRAWINGS

FIG. 3 to FIG. 6 are scanning electron microscopy (SEM) pictures of the cross-sections of metal oxide thin film substrates according to Examples of the present invention, in which FIG. 3 and FIG. 4 are pictures of Example 1 and Example 2 in which metal oxide thin films were formed by mixing $TiO_2$ and $SnO_2$ at different ratios, and FIG. 5 and FIG. 6 are pictures of Example 3 and Example 4 in which metal oxide thin films were formed by mixing $Al_2O_3$ and $SnO_2$ at different ratios;

DETAILED DESCRIPTION OF THE INVENTION

Reference will now be made in detail to a metal oxide thin film substrate for an organic light-emitting device (OLED) and a method of fabricating the same according to the present invention, embodiments of which are illustrated in the accompanying drawings and described below, so that a person having ordinary skill in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

Figure 1:
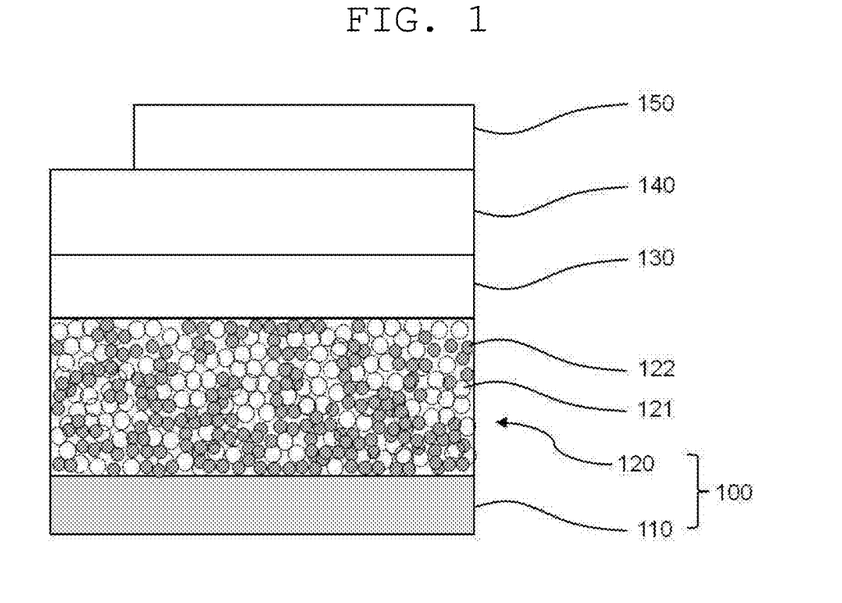
FIG. 1 is a cross-sectional view showing an organic light-emitting device (OLED) which has a metal oxide thin film substrate for an OLED according to an embodiment of the present invention.

As shown in FIG. 1, a metal oxide thin film substrate 100 for an OLED according to an embodiment of the present invention is a functional thin film substrate that improves the light extraction efficiency of the OLED in order to improve the luminance of a display or an illumination instrument which employs the OLED. The metal oxide thin film substrate 100 is disposed in the front part of the OLED, and protects the OLED from the external environment while serving as a path which allows light generated from the OLED to radiate outward.

Here, the OLED has a multilayer structure that includes a first electrode 130, an organic light-emitting layer 140 and a second electrode 150. The first electrode 130 can be an anode, and the second electrode 150 can be a cathode. The metal oxide thin film substrate 100 according to an embodiment of the present invention is disposed such that it adjoins to the first electrode 130. The first electrode 130, the organic light-emitting layer 140 and the second electrode 150 are disposed between a pair of encapsulation substrates which face each other. The metal oxide thin film substrate 100 according to an embodiment of the present invention serves as one of the encapsulation substrates while serving as an internal light extraction layer of the OLED.

The first electrode 130, acting as an anode, can be made of a metal or oxide, such as Au, In, Sn or indium tin oxide (ITO), that has a high work function in order to facilitate hole injection, whereas the second electrode 150, acting as a cathode, can be implemented as a metal thin film of Al, Al:Li or Mg:Ag that has a low work function in order to facilitate electron injection. When the OLED has a top emission structure, the second electrode 150 can have a multilayer structure that includes a semitransparent electrode of a metal thin film of Al, Al:Li or Mg:Ag and a transparent electrode of an oxide thin film of ITO in order to facilitate the transmission of light generated by the organic light-emitting layer. In addition, the organic light-emitting layer 140 includes a hole injection layer, a hole transport layer, an emissive layer, an electron transport layer and an electron injection layer which are sequentially stacked on the first electrode 130. According to this structure, when a forward voltage is applied between the first electrode 130 and the second electrode 150, electrons from the second electrode 150 migrate to the emissive layer through the electron injection layer and the electron transport layer, and holes from the first electrode 130 migrate to the emissive layer through the hole injection layer and the hole transport layer. The electrons and holes that have migrated into the emissive layer recombine with each other, thereby generating excitons. When such excitons transit from the excited state to the ground state, light is emitted. The brightness of light that is emitted as such is proportional to the amount of current that flows between the first electrode 130 and the second electrode 150.

The metal oxide thin film substrate 100 according to an embodiment of the present invention serves as both the internal light extraction layer and the encapsulation substrate of the OLED as described above, and includes a base substrate 110 and a metal oxide thin film 120.

The base substrate 110 is the substrate which supports the metal oxide thin film 120 which is formed on one surface thereof, and is the substrate which protects the OLED from the external environment while allowing light generated from the OLED to radiate to the outside.

The base substrate 110 is a transparent substrate, and can be implemented as any substrate that has superior light transmittance and superior mechanical properties. For instance, the base substrate 110 can be made of a thermally curable or ultraviolet (UV) curable polymeric material, such as an organic film, or a chemically-tempered glass, such as a soda-lime glass ($SiO_2$—CaO—$Na_2O$) or an aluminosilicate glass ($SiO_2$—$Al_2O_3$—$Na_2O$), in which the content of Na can be adjusted depending on the use. The soda-lime glass can be used when the OLED is used for illumination, whereas the aluminosilicate glass can be used when the OLED is used for a display.

According to an embodiment of the present invention, the base substrate 110 can be implemented as a laminated glass that has a thickness of 1.5 mm or less. Such a laminated glass can be fabricated by a fusion process or a floating process.

The metal oxide thin film 120 is formed on one surface of the base substrate 110. The metal oxide thin film 120 serves as an internal light extraction layer of the OLED which disturbs a waveguide mode formed by the first electrode 130 and the organic light-emitting layer 140, thereby increasing the quantity of light that is extracted to the outside.

Figure 2:
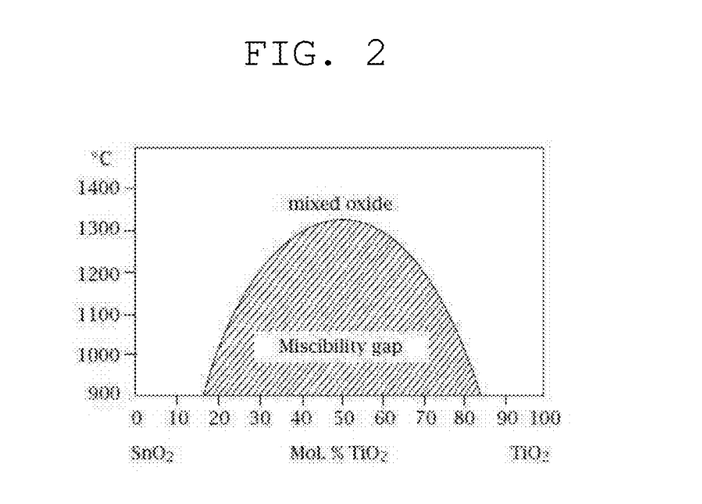
FIG. 2 is a phase diagram of two metal oxides of a metal oxide thin film according to an embodiment of the present invention.

For this, the metal oxide thin film 120 is made of a mixture of at least two metal oxides that have different refractive indices. At least two metal oxides can be selected from among $TiO_2$, $SnO_2$, $Al_2O_3$, MgO, $ZrO_2$ and ZnO. It is preferred that the selected metal oxides be mixed at a composition ratio that is positioned within the miscibility gap in the phase diagram, i.e. a ratio where they are not completely mixed with each other, as shown in the graph of FIG. 2. FIG. 2 shows a phase diagram of metal oxides of $SnO_2$ and $TiO_2$. In this case, for example, when the content ratio of $TiO_2$ with respect to $SnO_2$ ranges from 15 to 85 mol % at a temperature of about 1350° C. or below, $SnO_2$ and $TiO_2$ are within the miscibility gap, i.e. $SnO_2$ and $TiO_2$ are not completely mixed with each other. The composition ratio that belongs to the miscibility gap may differ when at least two metal oxides are selected, since each substance has unique properties. In addition, when the metal oxides are mixed at a ratio in the phase diagram where they are not completely mixed with each other, the content of each metal oxide included in the mixture can be 1% or more by volume ratio.

When the metal oxides are mixed at such a mixing ratio, the metal oxide thin film 120 is made of the metal oxides that have the shape of chunks. Since the metal oxides have different refractive indices, they can disturb the waveguide mode formed by the first electrode 130 and the organic light-emitting layer 140.

For instance, as shown in FIG. 1, the metal oxide thin film 120 can be a mixture of a first metal oxide 121 and a second metal oxide 122.

This metal oxide thin film 120 can be formed on the base substrate 110, for example, by spin coating. Due to the spin coating, the metal oxide thin film 120 is formed as a single thin planarization film. This can consequently preclude a related-art planarization film that was formed to planarize the surface of the internal light extraction layer, thereby realizing a structure in which the metal oxide thin film 120 and the first electrode 130 directly adjoin each other while forming a boundary therebetween. In addition, since the metal oxide thin film 120 is formed as a single thin planarization film, it is possible to minimize the amount of leakage current, thereby increasing the efficiency and longevity of the OLED.

Reference will be now made to a method of fabricating a metal oxide thin film substrate for an OLED according to an embodiment of the present invention.

The method of fabricating a metal oxide thin film substrate for an OLED according to an embodiment of the present invention includes, first, converting at least two metal oxides having different refractive indices into respective sol-gel solutions by a sol-gel method. The metal oxides that are used can be selected from among, but not limited to, $TiO_2$, $SnO_2$, $Al_2O_3$, MgO, $ZrO_2$ and ZnO. In the method, a sol solution is changed through gel into metal oxide in solid phase by a firing process. For example, $Al(O\text{-sec-}Bu)_3$ and isopropanol are mixed together and then, the mixture is stirred for one hour. After that, ethyl(acetoacetate) is added and the mixture is stirred for three hours. After that, the mixture is diluted with $H_2O$ and then isopropanol is added, thereby obtaining an $Al_2O_3$ sol-gel solution.

Afterwards, a composition ratio in which the selected metal oxides are positioned within the miscibility gap depending on the temperature in the phase diagram, i.e. a ratio where the selected metal oxides are not completely mixed with each other, is found, and then the sol-gel solutions are mixed at that composition ratio. The mixture is produced by controlling the composition ratio between the metal oxides and mixing the metal oxides such that the volume ratio of each metal oxide is 1% or more.

After that, a prepared glass substrate is coated with the mixture. Here, according to an embodiment of the present invention, the glass substrate can be coated with the mixture by spin coating using a spin coater. When the mixture is deposited by spin coating using the spin coater, it is possible to coat a large area with a thin film. In addition, since processing is simple and the spin coater is not expensive, there is an advantage in that the coating process can be performed easily and rapidly at low cost.

Afterwards, the mixture deposited on the base substrate by spin coating is dried. At this time, it is preferred that the mixture be dried at 110° C. for about 10 minutes.

Finally, the dried mixture is fired into a metal oxide thin film substrate that includes the base substrate and a single layer of metal oxide thin film which coats the base substrate. The process of firing the mixture can be carried out at 500° C. for 30 minutes. When fabricated in this fashion, the metal oxide thin film substrate has a metal oxide thin film which is transparent with a transmittance of 80% or greater, is flat, and is used for an internal light extraction layer of an OLED.

Example 1

Figure 3:
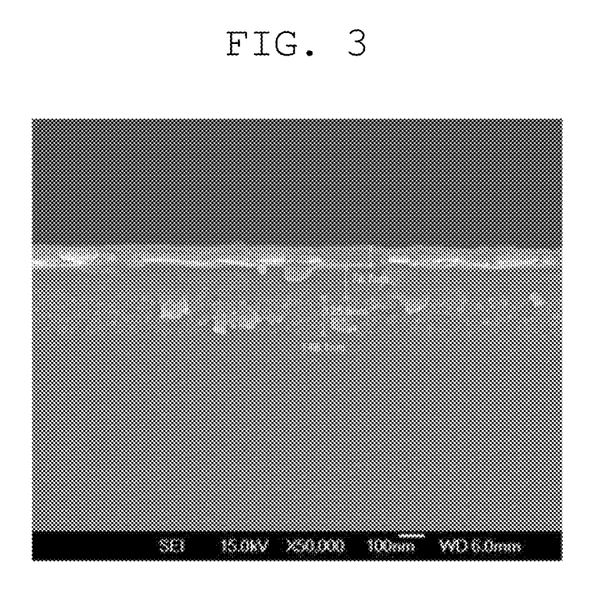

A mixture in which $TiO_2$ and $SnO_2$ were mixed at a ratio of 3:7 was deposited at a thickness of 148 nm on a 0.7 mm thick glass substrate by spin coating, thereby forming a metal oxide thin film. An anode made of ITO was then formed at a thickness of 165 nm on the metal oxide thin film. Afterwards, the cross-section of the resultant structure was photographed by scanning electron microscopy (SEM), as shown in FIG. 3, and light extraction efficiency measured.

Example 2

Figure 4:
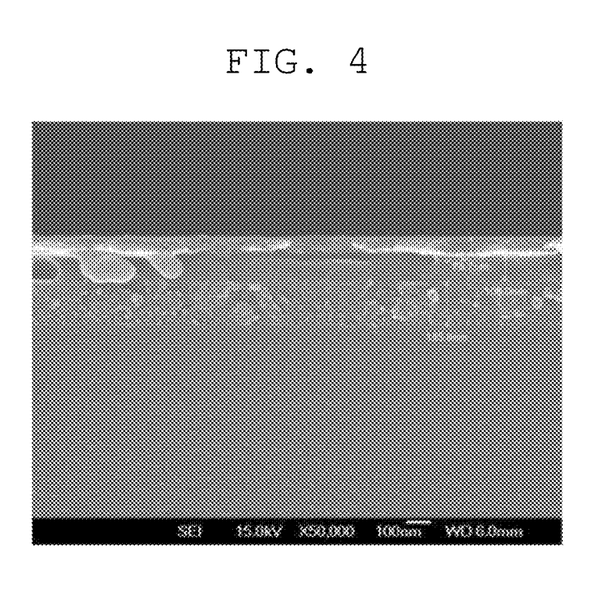

A mixture in which $TiO_2$ and $SnO_2$ were mixed at a mixing ratio of 7:3 was deposited at a thickness of 185 nm on a 0.7 mm thick glass substrate by spin coating, thereby forming a metal oxide thin film. An anode made of ITO was then formed at a thickness of 165 nm on the metal oxide thin film. Afterwards, the cross-section of the resultant structure was photographed by SEM, as shown in FIG. 4, and light extraction efficiency measured.

Example 3

Figure 5:
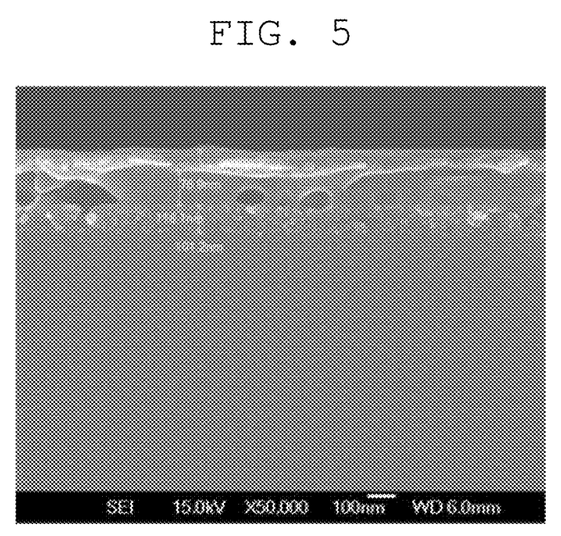

A mixture in which $Al_2O_3$ and $SnO_2$ were mixed at a mixing ratio of 3:7 was deposited to a thickness of 148 nm on a 0.7 mm thick glass substrate by spin coating, thereby forming a metal oxide thin film. An anode made of ITO was then formed at a thickness of 165 nm on the metal oxide thin film. Afterwards, the cross-section of the resultant structure was photographed by SEM, as shown in FIG. 5, and light extraction efficiency measured.

Example 4

Figure 6:
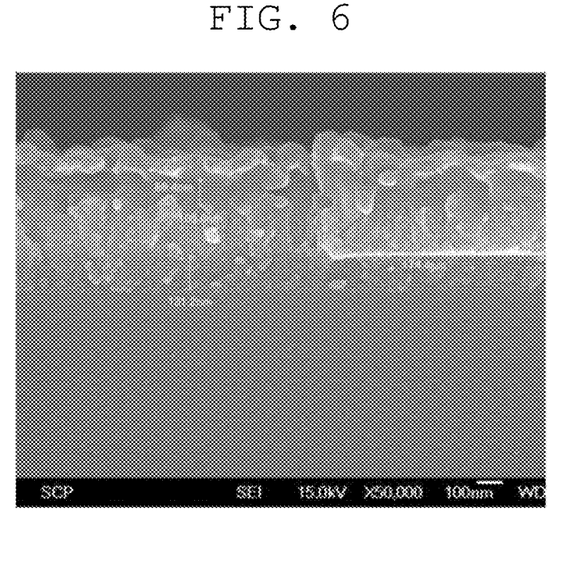

A mixture in which $Al_2O_3$ and $SnO_2$ were mixed at a mixing ratio of 7:3 was deposited to a thickness of 185 nm on a 0.7 mm thick glass substrate by spin coating, thereby forming a metal oxide thin film. An anode made of ITO was then formed at a thickness of 165 nm on the metal oxide thin film. Afterwards, the cross-section of the resultant structure was photographed by SEM, as shown in FIG. 6, and light extraction efficiency measured.

When light extraction efficiencies according to Examples 1 to 4 were measured, the light extraction efficiency of Example 1 in which $TiO_2$ and $SnO_2$ were mixed at the 3:7 ratio was 35.5%, the light extraction efficiency of Example 2 in which $TiO_2$ and $SnO_2$ were mixed at the 7:3 ratio was 41.4%, the light extraction efficiency of Example 3 in which $Al_2O_3$ and $SnO_2$ were mixed at the 3:7 ratio was 29.4%, and the light extraction efficiency of Example 4 in which $Al_2O_3$ and $SnO_2$ were mixed at the 7:3 ratio was 16.9%.

Analyzing the light extraction efficiencies of Example 1 to Example 4, it was observed that the light extraction efficiency of Example 2 in which $TiO_2$ and $SnO_2$ were mixed at the 7:3 ratio was most superior. It can be appreciated that the light extraction efficiency was increased when the ratio of $TiO_2$ in the mixture was higher than that of $SnO_2$. It can also be appreciated that the light extraction efficiency was decreased when $Al_2O_3$ was mixed with $SnO_2$ instead of $TiO_2$. It was observed that the light extraction efficiency was increased with the increasing thickness when $TiO_2$ and $SnO_2$ were mixed. In contrast, when $Al_2O_3$ and $SnO_2$ were mixed, the light extraction efficiency was increased with the decreasing thickness. It was concluded from these results that not only the type and mixing ratio between the metal oxides but also the optimized thickness of each metal oxide must be considered in order to improve the light extraction efficiency.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A method of fabricating a metal oxide thin film substrate of an organic light emitting device, comprising:
   converting at least two metal oxides having different refractive indices into respective sol-gel solutions;
   mixing the sol-gel solutions to form a mixture;
   coating a base substrate with the mixture;
   drying the mixture that coats the base substrate of the organic light emitting device; and
   firing the dried mixture into a metal oxide thin film,
   wherein mixing the sol-gel solutions comprises mixing the sol-gel solutions at a composition ratio between the metal oxides that is positioned within a miscibility gap depending on temperature in a phase diagram.

2. The method of claim 1, wherein the metal oxides are selected from the group consisting of $TiO_2$, $SnO_2$, $Al_2O_3$, MgO, $ZrO_2$ and ZnO.

3. The method of claim 1, wherein mixing the sol-gel solutions comprises mixing the sol-gel solutions such that a volume ratio of each of the metal oxides to the total metal oxides is 1% or more.

4. The method of claim 1, wherein coating the base substrate with the mixture comprises depositing the mixture on the base substrate by spin coating.

* * * * *

UNITED STATES PATENT AND TRADEMARK OFFICE
CERTIFICATE OF CORRECTION

PATENT NO. : 9,118,034 B2
APPLICATION NO. : 14/049345
DATED : August 25, 2015
INVENTOR(S) : Joo Young Lee et al.

Page 1 of 1

It is certified that error appears in the above-identified patent and that said Letters Patent is hereby corrected as shown below:

Title page, item [73] should read

[73] Assignee: Corning Precision Materials Co., Ltd; Republic of Korea.

Signed and Sealed this
Ninth Day of August, 2016

Michelle K. Lee
*Director of the United States Patent and Trademark Office*